(12) United States Patent
Gomer et al.

(10) Patent No.: US 12,039,670 B2
(45) Date of Patent: Jul. 16, 2024

(54) STRAND SIMULATION IN MULTIPLE LEVELS

(71) Applicant: Electronic Arts Inc., Redwood City, CA (US)

(72) Inventors: Simon Gomer, Stockholm (SE); Jeremy O'Brien, Reading (GB); Andrea Ferrario, Stockholm (SE); Robin Taillandier, Sundbyberg (SE); Leo Taslaman, Stockholm (SE)

(73) Assignee: ELECTRONIC ARTS INC., Redwood City, CA (US)

( * ) Notice: Subject to any disclaimer, the term of this patent is extended or adjusted under 35 U.S.C. 154(b) by 985 days.

(21) Appl. No.: 16/922,358

(22) Filed: Jul. 7, 2020

(65) Prior Publication Data

US 2022/0008826 A1  Jan. 13, 2022

(51) Int. Cl.
| | | |
|---|---|---|
| G06T 19/00 | (2011.01) | |
| G06F 30/20 | (2020.01) | |
| G06T 15/00 | (2011.01) | |

(52) U.S. Cl.
CPC .............. *G06T 19/00* (2013.01); *G06F 30/20* (2020.01); *G06T 15/005* (2013.01)

(58) Field of Classification Search
None
See application file for complete search history.

(56) References Cited

U.S. PATENT DOCUMENTS

| 11,030,786 | B1 * | 6/2021 | Bondich | G06T 11/60 |
| 2017/0061570 | A1 * | 3/2017 | Avkarogullari | G06T 1/20 |
| 2018/0374242 | A1 * | 12/2018 | Li | G06T 15/04 |
| 2021/0312695 | A1 * | 10/2021 | Zhang | G06T 15/04 |

OTHER PUBLICATIONS

Jansson, Erik S. V. et al. "Real-Time Hybrid Hair Rendering." Eurographics Symposium on Rendering (2019).*
Ward, Kelly et al., Adaptive Grouping and Subdivision for Simulating Hair Dynamics, http://gamma.cs.unc.edu/HAIR, Proc. of Pacific Graphics, 2003.

* cited by examiner

*Primary Examiner* — Aaron M Richer
(74) *Attorney, Agent, or Firm* — Gray Ice Higdon

(57) ABSTRACT

A method comprises determining positions of render strands based on a simulation model of simulation strands. Each simulation strand corresponds to a render strand. For a first range of values of a metric up to a threshold value, the simulation model is determined in a first simulation level using a first set of simulation strands. For a second range of values of the metric from a second threshold value, the simulation model is determined in a second simulation level using a subset of the first set of simulation strands. For metric values between the first and second threshold values, a transition between first and second simulation levels comprises computing the simulation model in the first level of detail. Positions of the render strands during the transition are derived from the first set of simulation strands having a first weight, and the second set of simulation strands having a second weight.

17 Claims, 9 Drawing Sheets

Figure 1c
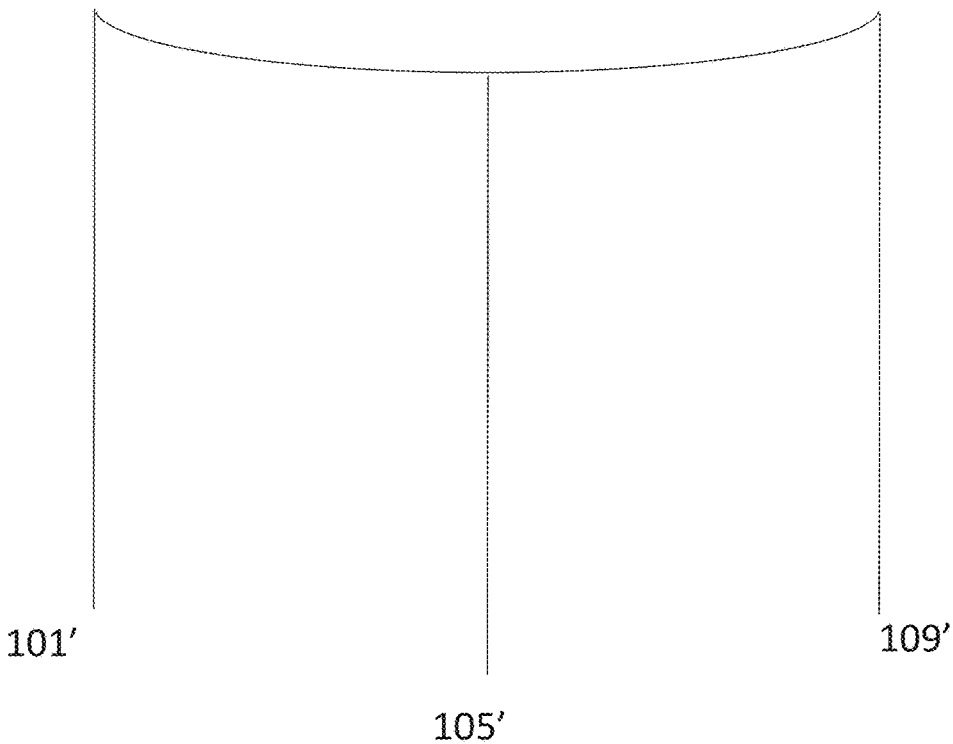
101'  105'  109'
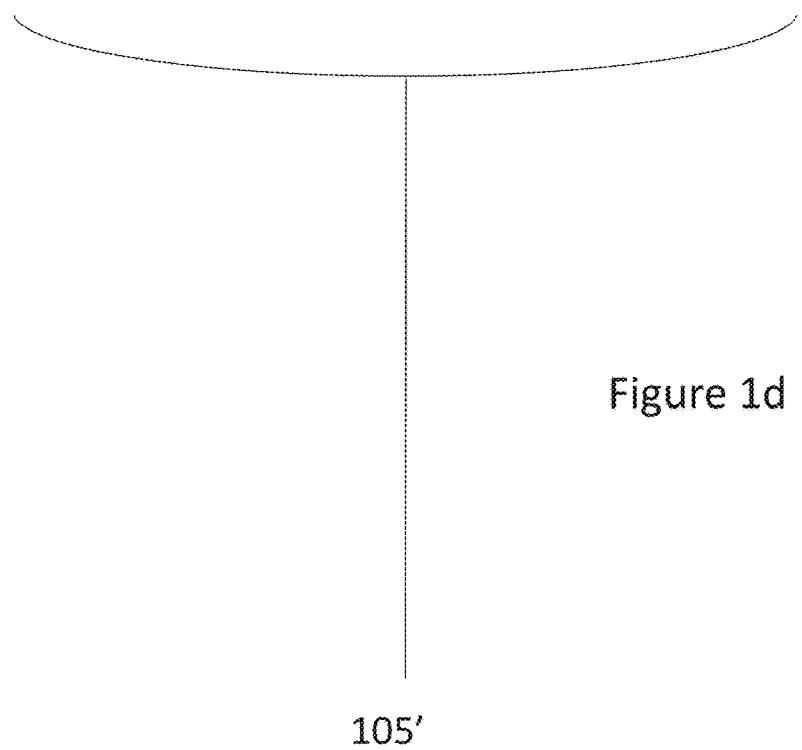
Figure 1d
105'

Figure 2a
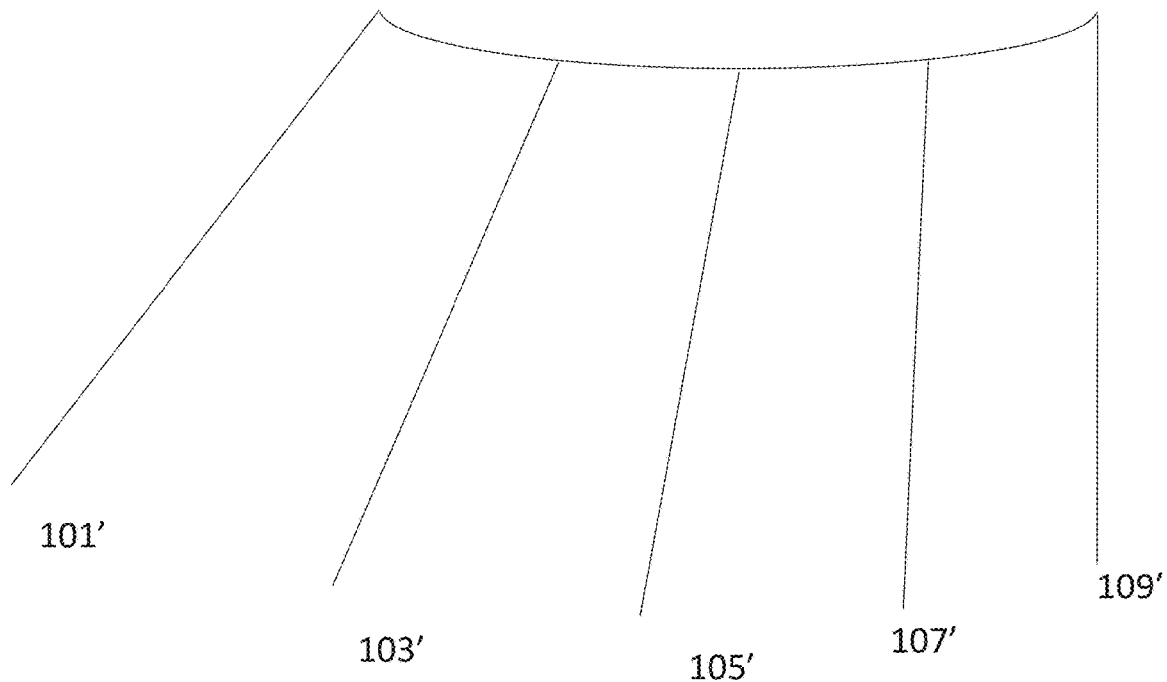
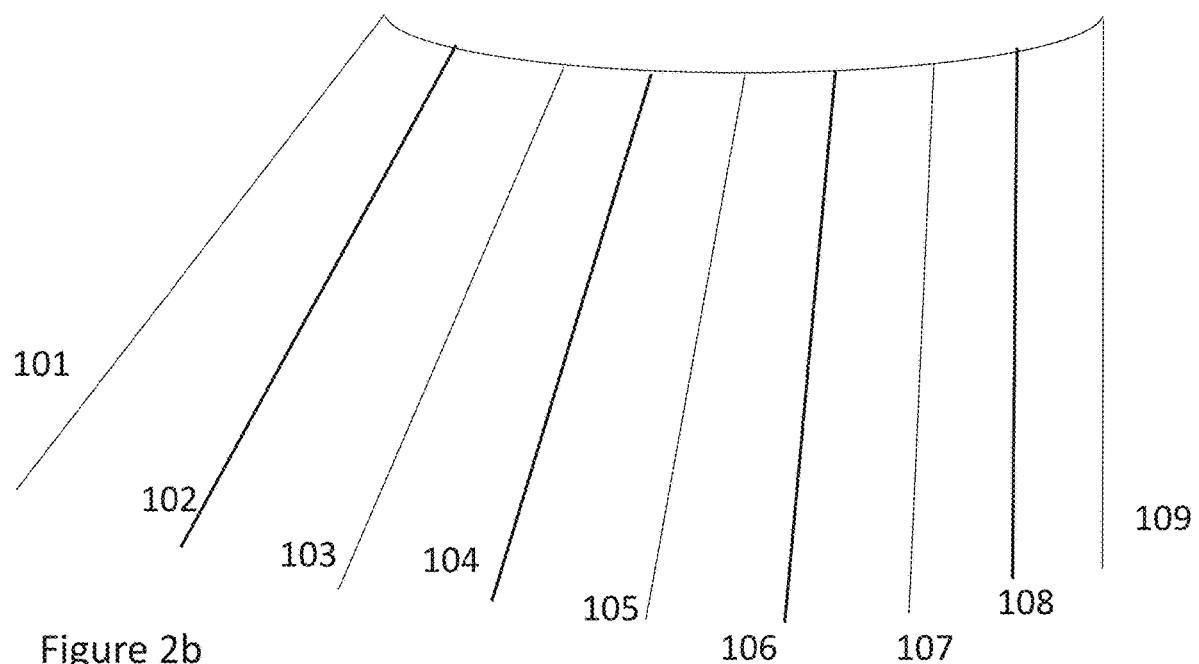
Figure 2b

Figure 2c
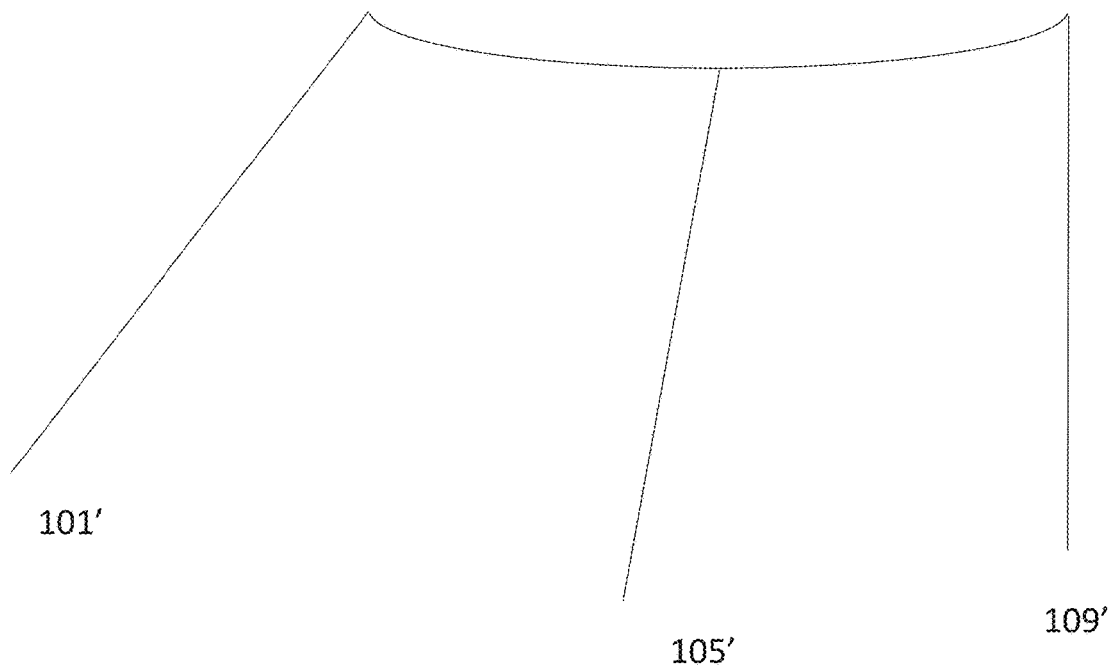
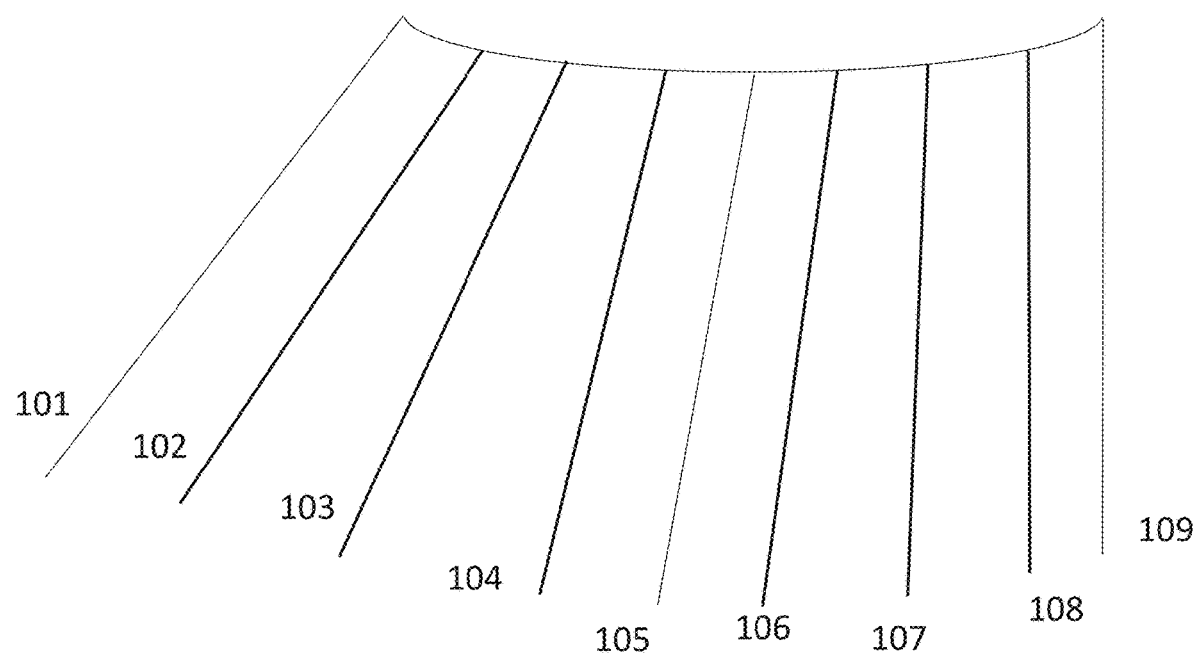
Figure 2d

Figure 2e
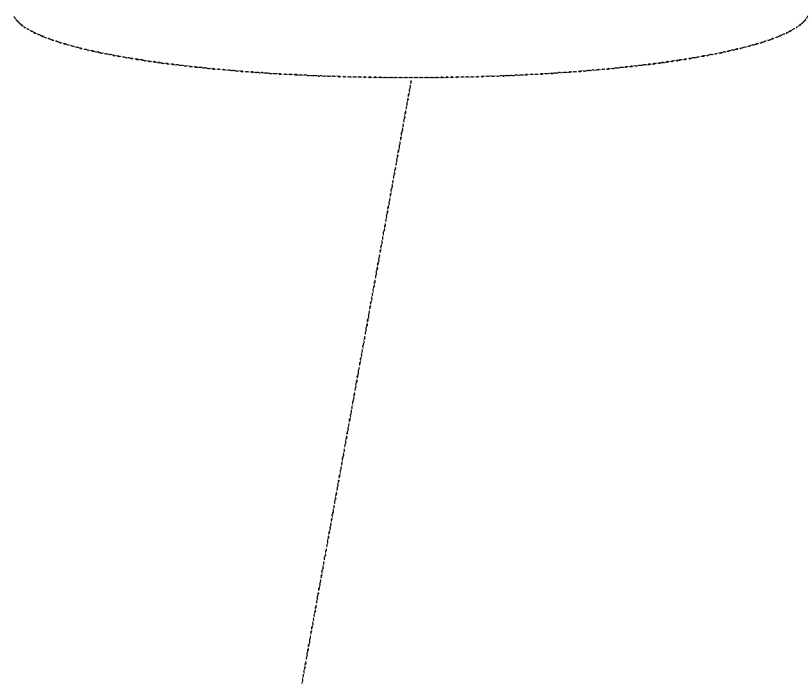
105'
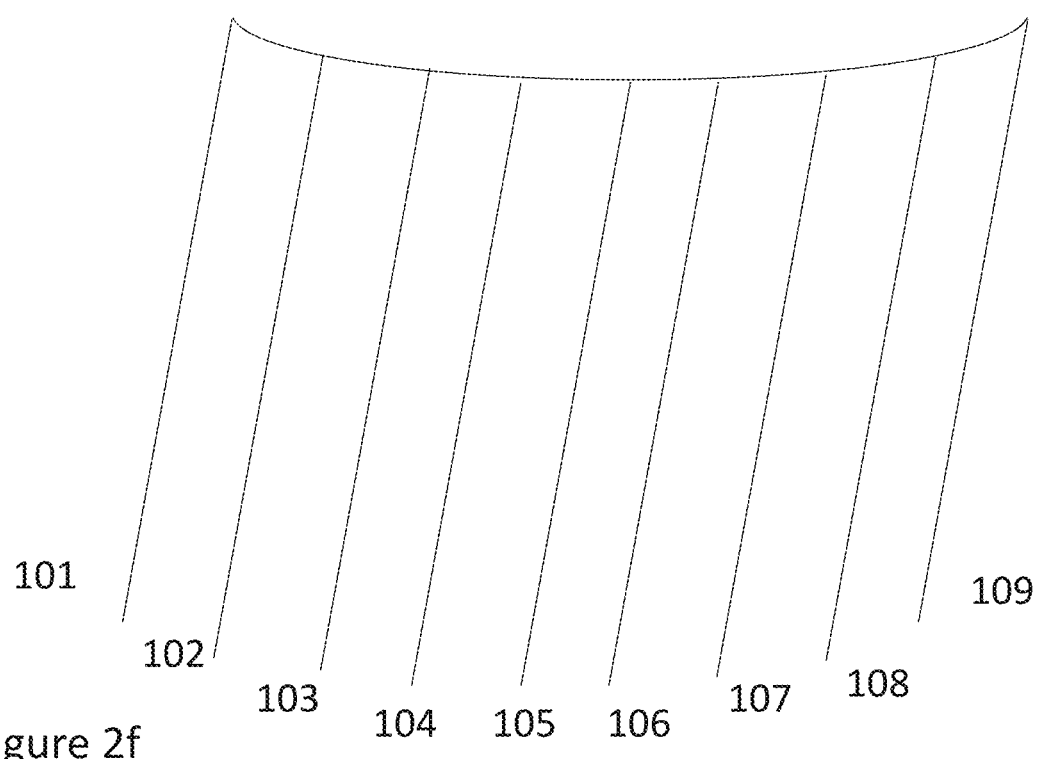
Figure 2f

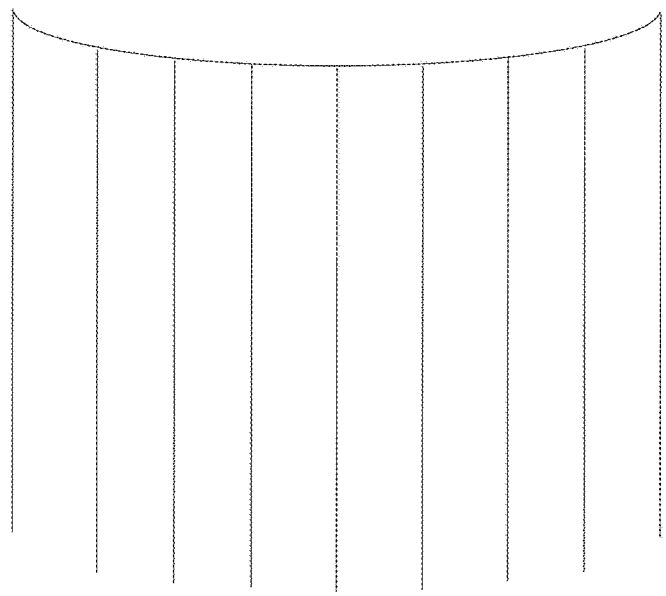
Figure 3a
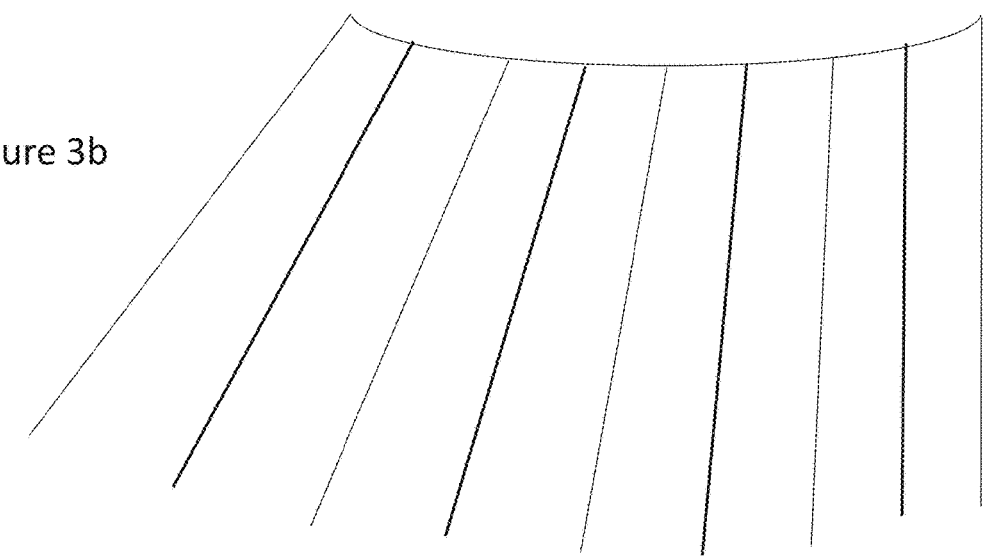
Figure 3b
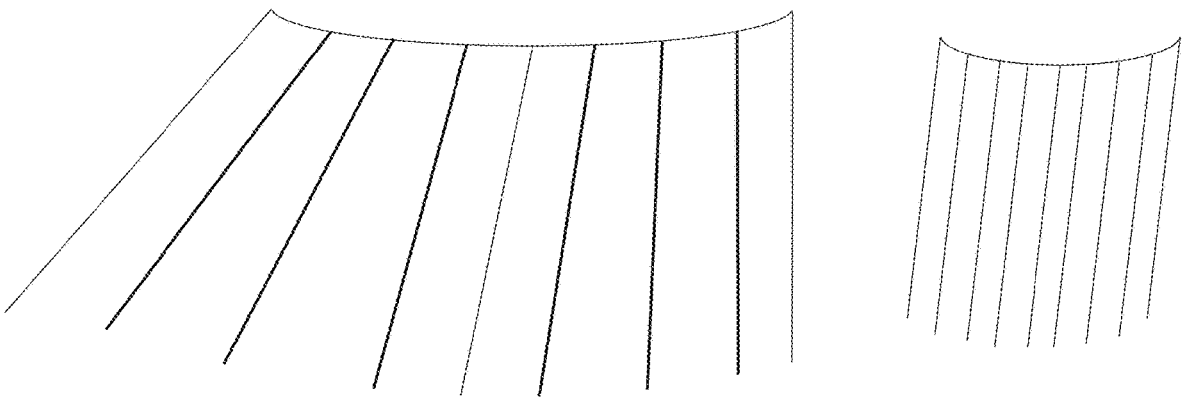
Figure 3c
Figure 3d

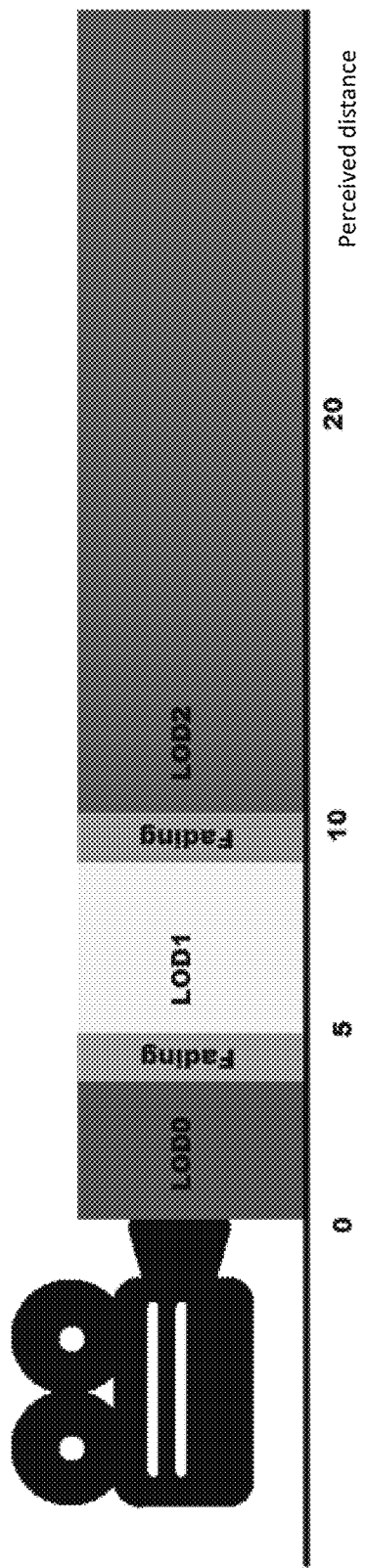

STRAND SIMULATION IN MULTIPLE LEVELS

BACKGROUND

In videogames, an authored set of strands such as the hair of a computer generated character may be provided relative to an object, e.g. the head of the character. The hair strands may be animated based on the movement of the character's head. For example, the hair strands may move statically together with the movement of the character's head.

More realistic movement of strands such as hair may be provided through a physical simulation. However, physical simulation can be computationally expensive in terms of processing resources.

SUMMARY

In accordance with a first aspect, the present specification describes a computer implemented method comprising: determining positions of a number of render strands based on a simulation model of simulation strands, wherein each simulation strand in the simulation model corresponds to a render strand, and the number of simulation strands is less than or equal to the number of render strands, wherein: for a first range of values of a metric less than or equal to a first threshold value, the simulation model is determined in a first simulation level based on a first set of the simulation strands; for a second range of values of the metric greater than or equal to a second threshold value, the simulation model is determined in a second simulation level based on a second set of the simulation strands, the second set of simulation strands corresponding to a subset of the first set of simulation strands; and for metric values between the first and second threshold values, a transition between the first simulation level and the second simulation level comprises: computing the simulation model in the first simulation level, and deriving positions of each render strand from the first set of simulation strands having a first weight and the second set of simulation strands having a second weight, wherein the first weight decreases as the value of the metric increases from the first threshold value to the second threshold value, and the second weight increases as the value of the metric increases from the first threshold value to the second threshold value.

Transitioning between the first simulation level and second simulation may further comprise: generating, for each render strand, a respective first temporary render strand having a respective first temporary position based on the first set of simulation strands; generating, for each render strand, a respective second temporary render strand having a respective second temporary position based on the second set of simulation strands; and determining a position for each render strand based on the first temporary position and the first weight, and the second temporary position and the second weight.

The computer implemented method may further comprise: interpolating, for each render strand, the respective first temporary position and respective second temporary position using the first weight and second weight, to determine the position for each render strand during the transition from the first simulation level to the second simulation level.

The computer implemented method may further comprise: determining interpolation data for the render strands for each of the first and second simulation levels respectively, wherein the interpolation data for each render strand in each of respective first and second simulation levels comprises indices of one or more selected simulation strands of the respective simulation level and a respective weight for each index, the selected simulation strands being selected based on a distance between initial authored positions of the simulation strands of the respective simulation level and an initial authored position of the render strand; storing the interpolation data for each of the first and second simulation levels; for the first simulation level, interpolating positions of the selected simulation strands using the interpolation data for the first simulation level for each render strand to compute the first temporary position, wherein for values of the metric less than or equal to the first threshold value, the first temporary position is determined to be the position of the render strand, for the second simulation level, interpolating positions of the selected simulation strands using the interpolation data for the second simulation level for each render strand to compute the second temporary position, wherein for values of the metric greater than or equal to the second threshold value, the second temporary position is determined to be the position of the render strand.

The metric may correspond to a perceived distance value, wherein the simulation level transitions from the first simulation level to the second simulation level as the perceived distance value increases from the first threshold value to the second threshold value.

When transitioning from the second simulation level to the first simulation level, the initial positions of the first set of simulation strands may be determined such that for each simulation strand included in the second set of simulation strands, the initial position corresponds to the position of the corresponding simulation strand of the second set of simulation strands, based on the determined simulation model in the second simulation level; and for each simulation strand of the first set of simulation strands not included in the second set of simulation strands, determining an initial position may comprise assigning a position of the corresponding render strand determined based on the simulation model in the second simulation level.

The second simulation level may be a non-simulated level, and the method further may comprise: determining a position of a temporary strand for each render strand, based on the first set of simulation strands and, for values of the metric less than or equal to the first threshold value, determining the position of each render strand to be the position of the corresponding temporary strand; determining a skinned position for each render strand based on skinning initial authored positions of render strands to an underlying rig and, for values of the metric greater than or equal to the second threshold value, determining the position of each render strand to be the corresponding skinned position; and determining the position of each render strand for values of the metric between the first and second threshold values by interpolating the position of the temporary strand and the skinned position using the first and second weights.

Each render strand may comprise a plurality of points, and determining positions of the render strands may comprise determining positions of each point of the plurality of points.

According to a second aspect, the present specification describes an apparatus comprising one or more processors and a memory, the memory comprising instructions that, when executed by the one or more processors, cause the one or more processors to perform: determining positions of a number of render strands based on a simulation model of simulation strands, wherein each simulation strand in the simulation model corresponds to a render strand, and the number of simulation strands is less than or equal to the number of render strands, wherein: for a first range of values of a metric less than or equal to a first threshold value, the simulation model is determined in a first simulation level based on a first set of the simulation strands; for a second range of values of the metric greater than or equal to a second threshold value, the simulation model is determined in a second simulation level based on a second set of the simulation strands, the second set of simulation strands corresponding to a subset of the first set of simulation strands; and for metric values between the first and second threshold values, a transition between the first simulation level and the second simulation level comprises: computing the simulation model in the first simulation level, and deriving positions of each render strand from the first set of simulation strands having a first weight and the second set of simulation strands having a second weight; and wherein the first weight decreases as the value of the metric increases from the first threshold value to the second threshold value, and the second weight increases as the value of the metric increases from the first threshold value to the second threshold value.

Transitioning between the first simulation level and second simulation may further comprise: generating, for each render strand, a respective first temporary render strand having a respective first temporary position based on the first set of simulation strands; generating, for each render strand, a respective second temporary render strand having a respective second temporary position based on the second set of simulation strands; and determining a position for each render strand based on the first temporary position and the first weight, and the second temporary position and the second weight.

The instructions, when executed by the one or more processors, may be further configured to cause the one or more processors to perform: interpolating, for each render strand, the respective first temporary position and respective second temporary position using the first weight and second weight, to determine the position for each render strand during the transition from the first simulation level to the second simulation level.

The instructions, when executed by the one or more processors, may be further configured to cause the one or more processors to perform: determining interpolation data for the render strands for each of the first and second simulation levels respectively, wherein the interpolation data for each render strand in each of respective first and second simulation levels comprises indices of one or more selected simulation strands of the respective simulation level and a respective weight for each index, the selected simulation strands being selected based on a distance between initial authored positions of the simulation strands of the respective simulation level and an initial authored position of the render strand; storing the interpolation data for each of the first and second simulation levels; for the first simulation level, interpolating positions of the selected simulation strands using the interpolation data for the first simulation level for each render strand to compute the first temporary position, wherein for values of the metric less than or equal to the first threshold value, the first temporary position is determined to be the position of the render strand, for the second simulation level, interpolating positions of the selected simulation strands using the interpolation data for the second simulation level for each render strand to compute the second temporary position, wherein for values of the metric greater than or equal to the second threshold value, the second temporary position is determined to be the position of the render strand.

When transitioning from the second simulation level to the first simulation level, the initial positions of the first set of simulation strands may be determined such that for each simulation strand included in the second set of simulation strands the initial position corresponds to the position of the corresponding simulation strand of the second set of simulation strands, based on the determined simulation model in the second simulation level; and for each simulation strand of the first set of simulation strands not included in the second set of simulation strands, determining an initial position comprises assigning a position of the corresponding render strand determined based on the simulation model in the second simulation level.

The second simulation level may be a non-simulated level, and the instructions, when executed by the one or more processors, are further configured to cause the one or more processors to perform: determining a position of a temporary strand for each render strand, based on the first set of simulation strands and, for values of the metric less than or equal to the first threshold value, determining the position of each render strand to be the position of the corresponding temporary strand; determining a skinned position for each render strand based on skinning initial authored positions of render strands to an underlying rig and, for values of the metric greater than or equal to the second threshold value, determining the position of each render strand to be the corresponding skinned position; and determining the position of each render strand for values of the metric between the first and second threshold values by interpolating the position of the temporary strand and the skinned position using the first and second weights.

The one or more processors may comprise at least one graphics processing unit.

According to a third aspect, the present specification describes a computer readable medium storing instructions which, when executed by a processor, cause the processor to perform: determining positions of a number of render strands based on a simulation model of simulation strands, wherein each simulation strand in the simulation model corresponds to a render strand, and the number of simulation strands is less than or equal to the number of render strands, wherein: for a first range of values of a metric less than or equal to a first threshold value, the simulation model is determined in a first simulation level based on a first set of the simulation strands; for a second range of values of the metric greater than or equal to a second threshold value, the simulation model is determined in a second simulation level based on a second set of the simulation strands, the second set of simulation strands corresponding to a subset of the first set of simulation strands; and for metric values between the first and second threshold values, a transition between the first simulation level and the second simulation level comprises: computing the simulation model in the first simulation level, and deriving the positions of the render strands from the first set of simulation strands having a first weight and the second set of simulation strands having a second weight, wherein the first weight decreases as the value of the metric increases from the first threshold value to the second threshold value, and the second weight increases as the value of the metric increases from the first threshold value to the second threshold value.

Transitioning between the first simulation level and second simulation may further comprise: generating, for each render strand, a respective first temporary render strand having a respective first temporary position based on the first set of simulation strands; generating, for each render strand, a respective second temporary render strand having a respective second temporary position based on the second set of simulation strands; and interpolating, for each render strand, the respective first temporary position and respective second temporary position using the first weight and second weight, to determine the position for each render strand.

The instructions, when executed by the processor, may be further configured to cause the processor to perform: determining interpolation data for the render strands for each of the first and second simulation levels respectively, wherein the interpolation data for each render strand in each of respective first and second simulation levels comprises indices of one or more selected simulation strands of the respective simulation level and a respective weight for each index, the selected simulation strands being selected based on a distance between initial authored positions of the simulation strands of the respective simulation level and an initial authored position of the render strand; storing the interpolation data for each of the first and second simulation levels; for the first simulation level, interpolating positions of the selected simulation strands using the interpolation data for the first simulation level for each render strand to compute the first temporary position, wherein for values of the metric less than or equal to the first threshold value, the first temporary position is determined to be the position of the render strand, for the second simulation level, interpolating positions of the selected simulation strands using the interpolation data for the second simulation level for each render strand to compute the second temporary position, wherein for values of the metric greater than or equal to the second threshold value, the second temporary position is determined to be the position of the render strand.

When transitioning from the second simulation level to the first simulation level, the initial positions of the first set of simulation are strands may be determined such that for each simulation strand included in the second set of simulation strands, the initial position corresponds to the position of the corresponding simulation strand of the second set of simulation strands, based on the determined simulation model in the second simulation level; and for each simulation strand of the first set of simulation strands not included in the second set of simulation strands, determining an initial position comprises assigning a position of the corresponding render strand determined based on the simulation model in the second simulation level.

The second simulation level may be a non-simulated level, and the instructions, when executed by the processor, are further configured to cause the processor to perform: determining a position of a temporary strand for each render strand, based on the simulation model in the first set of simulation strands and, for values of the metric less than or equal to the first threshold value, determining the position of each render strand to be the position of the corresponding temporary strand; determining a skinned position for each render strand based on skinning initial authored positions of render strands to an underlying rig and, for values of the metric greater than or equal to the second threshold value, determining the position of each render strand to be the corresponding skinned position; and determining the position of each render strand for values of the metric between the first and second threshold values by interpolating the position of the temporary strand and the skinned position using the first and second weights.

BRIEF DESCRIPTION OF THE DRAWINGS

Embodiments of the specification will now be described, by way of example only, with references to the accompanying drawings, in which:

FIG. 1c illustrates simulation strands in a second level of detail;
FIG. 1d illustrates simulation strands in a third level of detail;
FIG. 2a illustrates simulation strands in a first level of detail after a simulation step;
FIG. 2b illustrates render strands with positions determined based on the first level of detail;
FIG. 2c illustrates simulation strands in a second level of detail after a simulation step;
FIG. 2d illustrates render strands rendered based on the second level of detail;
FIG. 2e illustrates simulation strands in a third level of detail after a simulation step;
FIG. 2f illustrates render strands rendered based on the third level of detail;
FIG. 3a illustrates render strands rendered at a first perceived distance;
FIG. 3b illustrates render strands rendered at a first perceived distance after a simulation step;
FIG. 3c illustrates render strands at a second perceived distance after a simulation step;
FIG. 3d illustrates render strands at a third perceived distance after a simulation step;
FIG. 4 illustrates different perceived distance ranges and fading windows within the perceived distance ranges.

DETAILED DESCRIPTION

Figure 1A:
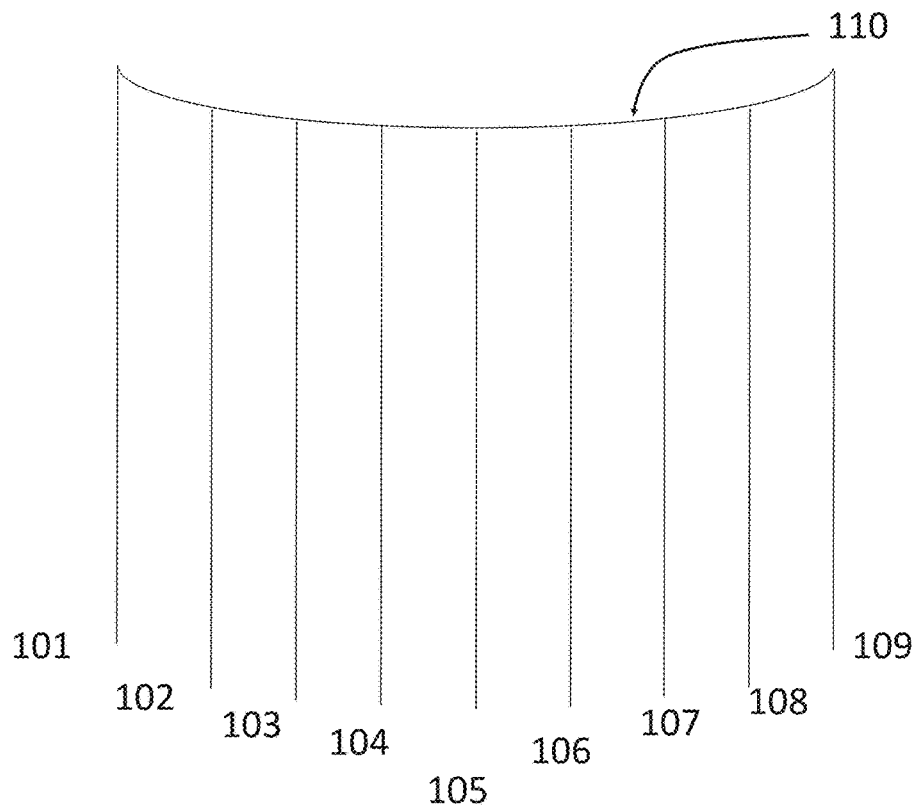
FIG. 1a illustrates a number of render strands.

The present specification relates to simulating strands in multiple simulation levels. As described in more detail below, present specification describes a method for transitioning smoothly between different simulation levels.

The method comprises determining positions of a number of render strands based on a simulation model of simulation strands, wherein each simulation strand in the simulation model corresponds to a render strand, and the number of simulation strands is less than or equal to the number of render strands. Simulation strands are strands which are used for computing the simulation model. Render strands correspond to strands specified by an author, and may be rendered on a display based on the simulation model. The method may comprise rendering the strands according to the determined positions.

The collective movement of strands may be simulated according to known physical models. However, simulating the movement of each render strand specified by the author would be costly in terms of processing resource and power. Therefore, the simulation is computed only for a subset of the render strands. The strands used to compute the simulation are referred to herein as the simulation strands When the number of simulation strands is less than the number of render strands, the processing cost of performing the simulation can be reduced compared to performing a simulation for each render strand.

The number of render strands is fixed, and correspond to each of the strands initially specified by the author. The positions of the render strands during runtime of a simulation are determined based on the simulation model of the simulation strands, for example by determining positions of the simulation strands and deriving the positions of the render strands from the positions of the simulation strands according to a preset rule. For example, the render strand positions may be determined by interpolation of the simulation strands. The simulation strands used to compute the simulation model is a subset of the render strands.

A greatly simplified example is shown in FIG. 1, illustrating different sets of simulation strands based on a set of authored render strands. It will be readily understood by those skilled in the art that the set of render strands may include hundreds or thousands of strands. The strands may represent, for example, strands of hair of a character in a videogame. In the example of FIG. 1, the strands may be hair strands of a ponytail. Line 110 may correspond to the top of the ponytail at the location that the hair is tied together. The top point of the strands may be fixed to a point along line 110, corresponding to the point at which the strands are fixed by the hair tie of the ponytail. In some examples, line 110 may also be considered to correspond to a scalp or hairline of a character, or other point at which one end of the strands of hair are fixed. More generally, the strands may include one end, the "root", which is provided in a fixed position, depending on the circumstances. It will be recognised that the strands may represent anything that can be physically simulated using strand-like behaviour. In the examples described herein, the strands correspond to hair of a computer generated character. In other examples, the strands may correspond to fur of an animal. Alternatively, the strands may correspond to blades of grass, or crops, for example.

The example set out in FIG. 1 is simplified in order to aid understanding by illustrating a small number of strands. In addition, the strands are illustrated as including two points, a start and an end point, with a straight line connecting the points representing the strand. However, it will be recognised that the strands may include a plurality of connected points. FIG. 1a illustrates an example of 9 render strands 101 to 109. When rendered on a display, each of strands 101 to 109 are rendered on the display. The movement of the render strands 101 to 109 is updated according to the simulation model.

Figure 1B:
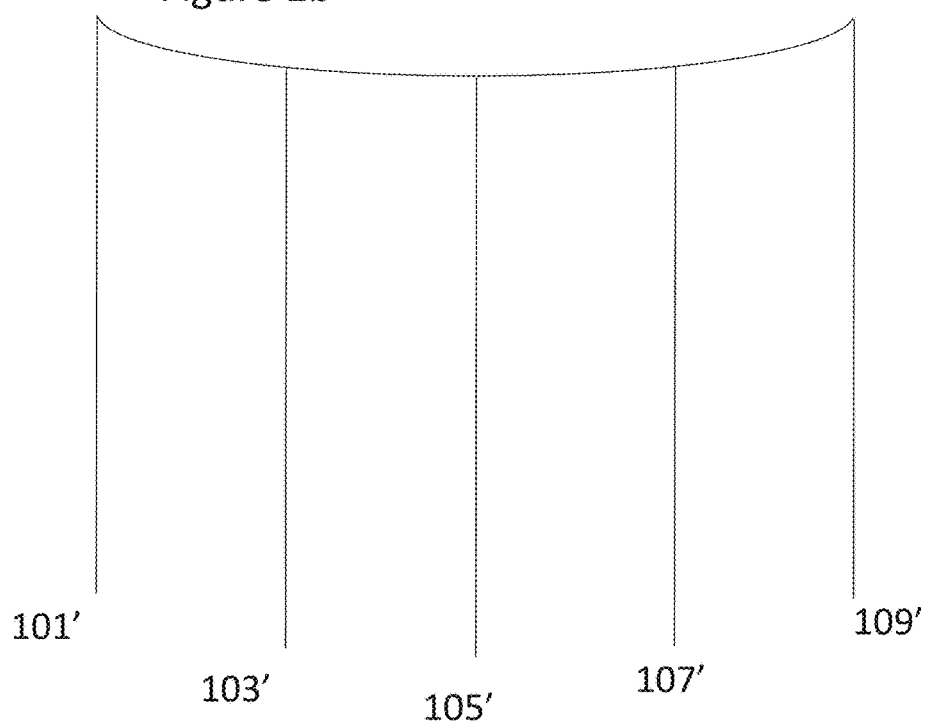
FIG. 1b illustrates a number of simulation strands in a first level of detail.

FIG. 1b illustrates a set of simulation strands 101', 103', 105', 107', 109' used for computing the simulation model. The simulation strands 101' 103' 105', 107', 109' correspond to render strands 101, 103, 105, 107, 109. As can be seen, the number of simulation strands is less than or equal to the number of render strands. Where the render strands comprise a plurality of connected points, then the simulation strands also comprise a plurality of corresponding connected points.

The simulation model is computed for simulation strands 101' 103' 105', 107', 109' according to a physical simulation model. Appropriate physical simulation models for simulation may be known per se to those skilled in the art and will not be described in detail here. After performing the simulation, the render strands are updated according to the simulation model. That is, the positions of the render strands are updated according to the simulation model. As described in more detail below, the render strands may be updated by interpolating the closest simulation strands to each render strand. Therefore, collective movement of the render strands can be performed based on a simulation model which uses a lower number of strands than the number of render strands. For strands that include a plurality of connected points, the positions of the render strands are determined for each point of the strand according to the simulation model.

As illustrated in FIG. 1, the simulation model can be computed using different numbers of simulation strands, generating the simulation model in different levels of detail, or "simulation levels". The number of simulation strands used to compute the simulation model depends on the simulation level in which the simulation model is to be computed. To compute the simulation model in a relatively high level of detail, a relatively high number of simulation strands may be used. This can be seen in the example of FIG. 1b, in which the number of simulation strands is over 50% of the number of render strands. In the example of FIG. 1, 5 simulation strands (101', 103', 105', 107', and 109') are used for the simulation model. Similarly, to compute the simulation model in a relatively lower level of detail, a relatively lower number of simulation strands may be used. When computing the simulation model in the relatively lower level of detail, the simulation strands used are a subset of the simulation strands used in computing the relatively higher level of detail. The examples of FIGS. 1c and 1d illustrate simulation strands used to compute the simulation model in lower simulation levels. In FIG. 1c, three simulation strands are used for the simulation model, i.e. a lower number compared to FIG. 1b in which the simulation model is computed in a higher simulation level.

In the example of FIG. 1c, it can be seen that the simulation strands 101', 105', and 109' used for the simulation in the lower simulation level are also used for the higher simulation level in the example of FIG. 1b. Therefore, simulation results of the simulation strands 101', 105', and 109' making up the lower simulation level are available by virtue of the higher simulation level having been computed, as strands 101', 105', and 109' are simulation strands in both the higher and lower levels of detail.

In the example of FIG. 1d, only a single simulation strand, 105', is used for the simulation model. Therefore, if the simulation model has been computed for the simulation level of either FIG. 1b or 1c, then it has also been computed for the lowest simulation level of FIG. 1d, as each of 1b and 1c include the simulation strand 105'. Accordingly, the simulation model in a lower simulation level can be determined according to the simulation model that has been computed for a higher simulation level, without needing to compute the simulation for the lower simulation level independently.

In general therefore, each simulation strand that is included in a lower simulation level is also a simulation strand in all higher simulation levels. Accordingly, if a simulation step (i.e. an update in the simulation strand position) has been computed for one simulation level, then the corresponding step has also been computed for all lower simulation levels, without any additional processing cost.

This correspondence between simulation strands and render strands wherein each simulation strand corresponds to a render strand, and wherein each strand simulated in a lower simulation level is also simulated in a higher simulation level of detail may also be referred to herein as the "strand hierarchy".

Once the simulation model has been computed in a given simulation level, the positions of the render strands are determined based on the simulation strands. The number of simulation strands used to compute the simulation model may be selected according to predetermined criteria which may depend on the simulation environment. For example, a high simulation level may include simulated strands corresponding to 100% of the render strands. In other examples, a high simulation level may include a number of simulation strands in the range from 50%-100%. A lower simulation level may include simulated strands corresponding to 10% of the render strands, for example. A further lower simulation level may include simulated strands corresponding to 1% of the render strands, for example.

The example of FIG. 2 shows a simplified example of determining positions of render strands according to the simulation model in different simulation levels of detail. FIG. 2a illustrates the simulation strands of FIG. 1b after undergoing a simulation step. As can be seen, each simulation strand undergoes a transformation during a simulation step. In this example, the strands are rotated around the top end, or root, of the strand. Each strand is rotated by a different amount. The simulation steps in the example of FIG. 2 are relatively large position transformations in order to aid understanding. However, it will be readily understood by the skilled person when implementing the simulation model that the simulation steps include relatively small position transformations in order to give the appearance of continuous motion of the render strands when rendered on a display. FIG. 2b illustrates render strands with positions determined based on the simulation model of FIG. 2a. The render strand positions are determined from the simulation strands based on a predetermined rule. In the example of FIG. 2, the render strand positions are updated based on an interpolation of the positions of a number of nearest simulation strands, as described in more detail below. Any suitable rule of deriving positions of render strands from the set of simulation strands may be used. The rule for determining the positions of render strands from simulation strands can be preset in advance according to a choice of a game developer, i.e. "in the pipeline". During runtime, after the simulation is performed on a number of simulation strands, of a given simulation level, the render strand positions are determined according to the preset rule, based on the results of the simulation.

In the example of FIG. 2, the relative positions of the render strands are not necessarily drawn to scale.

In the example of FIG. 2, the positions of the render strands correspond to the results of the interpolated simulation strands. Render strands 101, 103, 105, 107 and 109 correspond to simulation strands 101', 103', 105', 107', and 109' respectively. Render strand 102 may be positioned based on an interpolation of simulation strands 101', 103'. In FIG. 1a, render strand 102 is midway between simulation strands 101' and 103'. For each render strand, a set of nearest simulation strands are determined for each simulation level, based on the initial positions of the render strands and simulation strands, i.e. before the simulation is performed. The strand indices of the nearest simulation strands are stored for each render strand in each level of detail. Each of the nearest simulation strands for a given render strand may have a respective weight associated with it. In some examples, the weight may be a fixed weight. In other examples, the weight may be based on a distance between the simulation strand and render strand. The weight of the strand is stored together with the strand index. Where the positions of render strands are determined via interpolation, the strand indices of the nearest simulation strands and the respective weights may be referred to as "interpolation data".

The weighting of simulation strands 101' and 103' may therefore be such that they cause render strand 102 to be positioned midway between the simulation strands 101' and 103' following the interpolation. In a similar way, render strand 104 may have a position determined based on an interpolation of simulation strands 103' and 105'. Render strand 106 may be positioned based on an interpolation of simulation strands 105', and 107'. Render strand 108 may be positioned based on an interpolation of simulation strands 107', and 109'. Where simulation strands include a plurality of connected points, the position of each point of the simulation strands are determined from the simulation model. The corresponding points of the render strands may be determined from the nearest corresponding points of the nearest simulation strands. Accordingly, the positions of the render strands are updated based on the positions of the nearest simulation strands. It can be seen that the movement of the render strands following a simulation step therefore corresponds closely to the movement of the nearest simulation strands following the simulation step.

It will be recognised that any suitable number of nearest simulation strands may be used in the interpolation to determine the position of each render strand. The simulation strands to be used for interpolation of each render strand may be selected from the simulation strands of a given level of detail. The selected simulation strands may be selected based on a distance between initial authored positions of the simulation strands and an initial authored position of the render strand. For example, the selected simulation strands may be simulation strands that are nearest to the render strand in the initial authored positions, or may be selected from among those nearest to the render strand in the initial authored positions. The example shown is in 2 dimensions for simplicity to aid understanding, but it will be recognised that the strands may be provided in a virtual 3D environment.

FIG. 2c illustrates the simulation strands of FIG. 101c after undergoing the same simulation step as illustrated in FIG. 2a. The simulation of the strands 101', 105', and 109' is the same as the simulation of the strands in FIG. 2a. The level of detail, or simulation level, of the simulation in the example of FIG. 2c is lower than the example of FIG. 2a as it uses fewer simulation strands.

FIG. 2d illustrates render strands with positions determined based on the simulation model in the lower simulation level shown in FIG. 2c. Each render strand has its position updated based on an interpolation of simulation strands. In this example, the weightings for the simulation strands in the interpolations performed for the render strands depends on the distance between the render strand and the simulation strand. Accordingly, the movement of render strand 102 is more greatly influenced by the movement of simulation strand 101' and less influenced by the movement of the simulation strand 105', given that it is nearest to simulation strand 101' and therefore the weight of the position of simulation strand 101' is greater than the weights of the other simulation strands used in the interpolation. Similarly, the remaining render strands can be seen to be more greatly influenced by the position of the simulation strand with the shortest distance between it and the render strand, out of the simulation strands used for the interpolation.

FIG. 2e illustrates the simulation strand of FIG. 1d after undergoing the same simulation step as in FIGS. 2a and 2c. The simulation of the strand 105' is the same as the simulation of the strand 105' in FIG. 2a and FIG. 2c. The simulation level of the simulation in the example of FIG. 2e is lower than the examples of FIGS. 2a and 2c as it uses fewer simulation strands.

FIG. 2f illustrates render strands with positions determined based on the simulation model in the lowest simulation level shown in FIG. 2e. Each render strand has its position updated based on simulation strand 105' only. Therefore, the render strands following the simulation step exhibit the same relative movement as simulation strand 105'. Accordingly, the collective movement of the strands is based on the same simulation model as in FIGS. 2a and 2c, but based on fewer simulation strands. Simulating fewer strands saves processing resource and time compared to simulating a greater number of strands. The render strands are all updated based on the simulation model, however performing interpolation for each render strand based on the simulation model computed using fewer simulation strands is cheaper in terms of processing resources and time than computing simulation for all render strands.

The positions of the render strands may be determined based on the interpolated positions of the nearest simulation strands, plus a render point offset. The render point offset is determined based on the initial positions of the strands. The render point offset may be determined for each render strand for each level of detail, such that the initial interpolated position of the nearest simulation strands plus the render point offset equals the initial position of the render strand. The render point offset is determined in the pipeline and added to interpolated positions during runtime to arrive at the render strand positions.

Using a greater number of simulation strands has the effect of a more detailed simulation model, and therefore when rendered, the render strands will exhibit more realistic movement. However, it is not always necessary to simulate in a high level of detail. For example, for objects which are located at a short perceived distance, simulating in a high level of detail may be appropriate. However, for objects which are located at a long perceived distance, the object will appear smaller, and the user would not be able to discern as much visual detail. Therefore, strands relating to such an object may be simulated at a lower level of detail. The effect of the lower level of detail is that the movement of the strands appears to be more clumped together, and so the overall movement of the strands will be less realistic. However, at longer distances, this is less noticeable.

Therefore, in some examples, the level of detail of the simulation model is chosen according to a perceived distance of the render strands. In other examples, the simulation level may be chosen according to a time. In other examples, the simulation level may be chosen based on a number of computer generated characters to be rendered on a screen. For example, as the number of characters increases, the simulation level may decrease in order to reduce the overall computation effort if performing simulation for a number of different characters.

In some examples, the method comprises determining the positions of the render strands based on the simulation model at a level of detail corresponding to a perceived distance range. However, it will be recognised that the distance values referred to herein may correspond to values of a metric relating to a property other than distance.

FIG. 3a illustrates the render strands, which may correspond to strands of a ponytail, before a simulation step occurs. FIG. 3b illustrates the render strands of the ponytail at a close perceived distance after a simulation step has occurred. The perceived distance is, for example, a distance in a first distance range of 0-5 m. The simulation step is the same simulation step illustrated in FIG. 2. Because of the relatively close perceived distance, the render strands are rendered based on the simulation in the higher simulation level as described with reference to FIG. 2b. The viewer therefore perceives the ponytail as being large on the display because of the close perceived distance, and accordingly movement of the ponytail is observed in a high level of detail.

FIG. 3c illustrates the render strands of the ponytail at a further perceived distance than illustrated in FIG. 3b, and also illustrates the render strands after the same simulation step has occurred. The perceived distance is, for example, a distance in a second distance range of 5-10 m. The simulation step is the same simulation step illustrated in FIG. 2. Because of the relatively further perceived distance compared to FIG. 3b, the render strands are rendered based on the simulation in the lower simulation level as described with reference to FIG. 2d. Because the perceived distance is further than the example of FIG. 3b, the viewer perceives the ponytail as being smaller in size on the display. Accordingly, due to the lower simulation level of the simulation model at the greater perceived distance, the level of detail of movement of the hair strands is observed to be lower.

FIG. 3d illustrates the render strands of the ponytail at a further perceived distance than illustrated in FIG. 3c, and also illustrates the render strands after the same simulation step has occurred. The perceived distance is, for example, a distance in the range 10-20 m. The simulation step is the same simulation step illustrated in FIG. 2. Because of the relatively further perceived distance compared to FIGS. 3b and 3c, the render strands are rendered based on the simulation in the lowest simulation level as described with reference to FIG. 2f. Because the perceived distance is further than the example of FIGS. 3b and 3c, the viewer perceives the ponytail as being smaller in size on the display. Accordingly, due to the lower simulation level of the simulation model at the greater perceived distance, the level of detail of movement of the hair strands are observed to be lower than the examples of FIGS. 3b and 3c.

Accordingly, the cost of processing resources can be reduced for simulations of strands at greater perceived distances by simulation in lower levels of detail compared to strands at closer perceived distances. The number of simulation strands used for the simulation model may correspond to a distance range of the perceived object. Similarly, when the metric relates to properties other than perceived distances, the cost of processing resources can be reduced for simulations of strands according to the chosen property, based on the value of the metric.

When switching between simulation levels, the determined positions of render strands are generally not continuous over a simple transition between the two levels of detail. Simply switching from one level of detail to a second level of detail may cause render strands to jump from the determined position in one simulation level to the determined position in the second simulation level.

For example, the position of render strand 102 in the example of FIG. 2b is different than in the example of FIG. 2d, and similarly the position of render strand 102 in FIG. 2d is different to the position in FIG. 2f. Therefore, it can be seen that the determined positions of the render strands depends on the simulation level. The positions of each render strand 101, 102, 103, 104, 105, 106, 107, 108, and 109 in the example of FIG. 2 can be seen to depend on the simulation strands of the different simulation levels, arriving at different positions depending on the level.

Therefore, as described in more detail below, the method of the present specification provides for a smooth transition between simulation levels during a window between first and second threshold values. The window may be referred to herein as a "fading window". The examples discussed are in the context of the metric values being perceived distance values, although any other suitable property may be used as the value of the metric.

During the so called "fading window", the render strands smoothly transition between simulation levels by combining the simulation levels together with corresponding weights based on the value of the metric within the fading window. In the example of perceived distances, the fading window may be a sub-range within one of the perceived distances ranges, between a closer perceived distance range and a greater perceived distance range. More generally however, the fading window may be a range of metric values between two threshold distance values.

For example, with reference to FIG. 4, a distance range of 0-5 m may include a fading window at 4-5 m. A distance range of 5-10 m may include a fading window at 9-10 m. In this case, for the fading window at 4-5 m, the first threshold value is 4 m, and the second threshold value is 5 m. For the fading window at 9-10 m, the first threshold value is 9 m and the second threshold value is 10 m.

During the fading window, the simulation model is computed for the higher simulation level. Due to the strand hierarchy described above, the results of the lower simulation level are available through computing the simulation model in the higher simulation level. That is, the simulation model results for all of the simulation strands for the lower simulation level are available from the results of the computation of the simulation model in the higher simulation level, without requiring any additional processing cost.

In order to smoothly transition between the higher simulation level and lower simulation level, a respective weight for each simulation level is determined based on the distance into the fading window. The higher simulation level has a first respective weight, where the weight decreases as the metric value (e.g. perceived distance value) increases. The lower simulation level has a second respective weight, where the weight increases as the metric value (e.g. perceived distance value) increases. The positions of the render strands are derived from the first set of simulation strands and the second set if simulation strands and the first and second respective weights. Accordingly, as the perceived distance value (or other metric value) increases, the positions of the render strands gradually shift from the simulation result in the higher simulation level to the simulation result in the lower simulation level.

In one example with reference to FIG. 4, for distance values up to and including 4 m, the simulation model is determined in the higher simulation level, $LOD_0$, which may correspond, for example, to the simulation level illustrated in FIG. 1b. After the threshold value of 4 m, at distances closest to 4 m, the weight is strongly in favour of the higher simulation level $LOD_0$. For values of the metric within the fading window below a threshold value of 5 m, at distances closest to 5 m, the weight is strongly in favour of the lower simulation level $LOD_1$, which may correspond, for example, to the simulation level illustrated in FIG. 1c. For the distances in between the threshold values, the weight changes depending on the distance into the fading window as described. For values of the metric greater than or equal to the threshold value of 5 m, the simulation model is determined in the lower simulation level $LOD_1$, and the render strand positions determined based only on the lower simulation level. After threshold value of 9 m, at distances closes to 9 m, the weight is strongly in favour of the simulation level $LOD_1$. For values of the metric within the fading window between below the threshold value of 10 m, at distances closest to 10 m, the weight is strongly in favour of the lowest simulation level $LOD_2$, which may correspond, for example, to the simulation level illustrated in FIG. 1d. For the distances in between the threshold values, the weight changes depending on the distance into the fading window as described. For values of the metric greater than or equal to the threshold value of 10 m, the simulation model is determined in the lowest simulation level $LOD_2$.

Accordingly, if the determined position of the render strand according to a first simulation level would be noticeably different to the determined position of the render strand according to a second simulation level, the transition can be made smoothly by virtue of the applied weight in the fading window. The movement of the render strands can therefore appear to be continuous, without jumping from a position according to the first simulation level to a position according to the second simulation level. Accordingly, a more realistic motion of the strands can be experienced by the viewer.

Figure 5:
FIG. 5 is a flow chart illustrating a method according to the present specification.

FIG. 5 is a flow chart illustrating the steps of the method.

In Step S501, the method comprises determining, for each render strand, a number of nearest simulation strands. As described above, the number of nearest simulation strands may be any suitable number, such as 3 for example. The nearest simulation strands are determined for each render strand for each simulation level. The nearest simulation strands each have a strand index which may be stored as interpolation data, to indicate simulation strands to be used for interpolation. In the examples described herein, the nearest simulation strands for each render strand are described as being used for interpolation, referring to those simulation strands that have an initial authored position nearest to the initial authored position of the render strand. However, more generally, the interpolation data may comprise the indices of one or more selected simulation strands of the respective simulation level, the selected simulation strands being selected based on a distance between initial authored positions of the simulation strands of the respective simulation level and an initial authored position of the render strand. For example, the selected simulation strands for each render strand may comprise simulation strands that are nearest to the render strand in the initial authored positions, or may comprise simulation strands selected from among those that are nearest to the render strand in the initial authored positions.

For first and second simulation levels, the first simulation level is based on a number of simulation strands, where each simulation strand corresponds to a render strand, and the number of simulation strands is less than or equal to the number or render strands. The second simulation level is based on a subset of the first set of simulation strands. However, there may be more than two simulation levels. For each render strand and for each simulation level a number of nearest simulation strands is determined. In some examples, the same number, such as 3 for example, may be used for all render strands and all simulation levels. In other examples, a different number may be used for each render strand and in each simulation level.

In step S502, the method comprises determining respective weights for each nearest simulation strand. The strand indices of the nearest simulation strands are stored together with the respective weights for each render strand, and in each level of detail. The strand indices of the nearest simulation strands and respective weights may also be referred to as interpolation data.

The weights may be determined based on the distance of each nearest simulation strand to a given render strand, with the weight of a nearest simulation strand increasing as the distance to the render strand decreases. That is, for a given render strand with a set of determined nearest simulation strands, the weights are determined to be higher the closer a nearest simulation strand is compared to the other nearest simulation strands. In contrast, the weights are determined to be smaller the further away a nearest simulation strand is from the given render strand compared to the other nearest simulation strands. For nearest simulation strands of approximately equal distance to the given render strand the weights are determined to be approximately equal.

In addition to the weights, a render point offset is determined for each render strand in each level of detail. The render point offset is calculated such that the initial interpolated positions of the nearest render strands plus the render point offset equals the initial position of the render strand. Therefore, when the render point is added to the interpolated position during runtime, the render strand position is provided at a fixed offset from the interpolated position.

Steps S501 and S502 relate to determining interpolation data for the render strands for each of the first and second simulation levels, wherein the interpolation data for each render strand comprises indices of the selected simulation strands near to a given render strand and a respective weight for each index; and storing the interpolation data for each of the first and second simulation levels. However, any suitable fixed data set providing for render strands to be computed from the sets of simulation strands may be used, according to a preset rule. Therefore, the specific steps of S501 and S502 may be modified accordingly.

Steps S501 and S502 are performed in the pipeline. The interpolation data, or other data sets, are fixed sets of data which are used to compute the positions of the render strands during runtime, after performing the simulation model on a set of simulation strands.

During runtime, the simulation is performed. The simulation level used to compute the simulation model depends on the value of a metric as described above.

For values of the metric less than or equal to a first threshold value v1, the method proceeds to step S503, where, for a first range of values of a metric less than or equal to a first threshold value, the simulation model is determined in the first simulation level based on the first set of the simulation strands. For example, with reference to FIG. 1, the simulation strands of FIG. 1b are used for determining the simulation.

In step S504, the method comprises determining the positions of the render strands based on the simulation model in the first simulation level. The positions of the render strands are determined based on the simulation strands according to the data set and preset rule determined in steps S501 and S502. In the case that the positions of the render strands are to be determined based on interpolation according to stored interpolation data, the method comprises, for each render strand, interpolating positions of a number of nearest simulation strands using the interpolation data for the first level of detail. The render point offset is added to the interpolated position to generate a first temporary position. For metric values less than or equal to the threshold value, the first temporary positions are determined to be the positions of the render strands.

For values of the metric greater than the first threshold value v1 and less than the second threshold value v2, the method during runtime follows the steps S505 to 508. These steps are performed during the fading window, i.e. a transition between the first simulation level and the second simulation level. The method at step S505 comprises computing the simulation model in the first simulation level based on the first set of simulation strands. The simulation strands of the second simulation level are included in the simulation model of the first simulation level due to them being a subset of the first simulation level.

The method of the present specification further comprises determining the position of the render strands according to the simulation model in the first simulation level and second simulation level having respective weights. The positions of the render strands are derived from the first set of simulation strands having a first weight and the second set of simulation strands having a second weight. The first weight decreases as the value of the metric increases from the first threshold value to the second threshold value, and the second weight increases as the value of the metric increases from the first threshold value to the second threshold value. The positions may be derived from the sets of simulation strands according to any appropriate preset rule. Steps S506-508 set out an example of determining the positions of the render strands based on temporary render strands determined in the first and second levels of detail.

In step S506, the method comprises generating, for each render strand, a respective first temporary render strand having a respective first temporary position based on the first simulation level. The first temporary render strand may be determined, for example, through interpolation of the nearest simulation strands for a given render strand in the first level of detail. The first temporary position may include the render offset value for the given render strand determined according to the first level of detail.

In step S507, the method comprises generating, for each render strand, a second temporary render strand having a second temporary position based on the second simulation level. The second temporary position may be computed, for example, through interpolation of the nearest simulation strands for a given render strand in the second level of detail. The second temporary position may include the render offset value for the given render strand determined according to the second level of detail.

In step S508, the method comprises determining the position of the render strands based on the first temporary position and a first weight, and the second temporary position and a second weight. The first and second weights are based on the value of the metric, with the first weight decreasing as the value of the metric increases from the first threshold value to the second threshold value, and the second weight increasing as the value of the metric increases from the first threshold value to the second threshold value.

The method at step S508 may comprise interpolating, for each render strand, the respective first and second temporary positions using the first and second weights, to determine the position for each render strand during the transition between the first and second simulation levels. The weights may be combined in a weighted sum or other weighted function to interpolate the positions of the render strands from the first and second temporary positions. By weighting the simulation levels according to the value of the metric, the transition between simulation levels can be made smoothly.

Instead of generating two temporary strands and subsequently interpolating the positions of the temporary strands, the simulation strands of the first and second simulation strands, respective weights and render offsets may be input into a single computation for each render strand to determine the position of the render strand. The resulting position of the render strand obtained from this single computation may be identical to the position the render strand obtained from first generating two temporary strands and subsequently interpolating the positions of the temporary strands.

For values of the metric greater than or equal to a second threshold value v2, the method proceeds to step S509, where, for a second range of values of a metric greater than or equal to a second threshold value, the simulation model is determined in the second simulation level based on the second set of the simulation strands.

In step S510, the method comprises determining the positions of the render strands based on the simulation model in the second simulation level. The positions of the render strands are determined based on the simulation strands according to the data set and preset rule determined in steps S501 and S502. In the case that the positions of the render strands are to be determined based on interpolation according to stored interpolation data, the method comprises, for each render strand, interpolating positions of a number of nearest simulation strands using the interpolation data for the second level of detail. The render point offset is added to the interpolated position to generate a second temporary position. For metric values greater than or equal to the second threshold value, the second temporary positions are determined to be the positions of the render strands.

When moving from a higher simulation level to a lower simulation level, the method comprises using the lower simulation level in combination with the higher simulation level for determining the positions of the render strand positions after the metric value increases beyond the first threshold value. As the lower simulation level is a subset of the higher simulation level, the simulation is performed in the higher simulation level, and the positions of render strands determined based on the higher and lower simulation levels as described above. Once the second threshold value is reached, the simulation is performed for the second simulation level only.

When moving from a lower simulation level to a higher simulation level, the simulation in the higher simulation level cannot be simply introduced as the value of the metric falls below the second threshold. In order to compute a physical simulation on a number of strands, a simulation history of the strands is required in order to compute the motion based on the previous motion of the strands. When transitioning from the lower simulation level to the higher simulation level, the higher simulation level includes simulation strands which do not have a simulation history. That is, prior to entering the fading window, the simulation model was only computed for the subset of simulation strands that are included in the lower simulation level. The simulation strands of the higher simulation level not included in the subset of simulation strands do not have a computed simulation history. However, as each simulation strand corresponds to a render strand under the strand hierarchy according to the present specification, the history of the corresponding render strands can be used to provide a history for simulation strands of the higher simulation level. That is, the history of the render strands determined based on the lower simulation level prior to the transition to the higher simulation level can be utilised to provide the history data of the corresponding simulation strands of the simulation model in the higher simulation level. Therefore, the simulation can be computed for any simulation strands which do not have a simulation history. For the simulation strands included in the subset of simulation strands, simulation history will already be present due to the lower simulation level being computed for the subset of simulation strands.

When the fading window is reached, computing the simulation in the higher simulation level may begin by assigning an initial position to each simulation strand of the simulation strands of the higher level of detail for a first simulation step. For each of the simulation strands of higher simulation level, which comprises the subset of simulation strand making up the lower simulation level, the initial positions of the subset of strands are already computed by virtue of the simulation having been computed in the lower simulation level. In some examples, initial positions of the subset of strands are assigned by assigning a position corresponding to the position of the corresponding simulation strand in the lower level of detail. For each of the simulation strands of the higher level of detail not included in the subset of simulation strands there is no corresponding initial simulated position. Therefore, the remaining simulation strands of the higher level of detail are assigned an initial position corresponding to a position of the corresponding render strand, as determined based on the simulation model in the first level of detail. Therefore, because each simulation strand corresponds to a render strand, the render strand position history may be utilised to begin the computation of the simulation model in a higher level of detail when transitioning from a lower level of detail to the higher level of detail.

At the first value of the metric within the fading window below the second threshold value, the simulation model is computed in the higher level of detail, using the assigned initial positions for the first simulation step and using the corresponding render strand history for simulation strands which do not have a strand history. The positions of the render strands during simulation in the fading window are determined according to a combination of the higher level of detail and lower level of detail as described above while the perceived distance is within the fading window distance range.

After the metric value reduces to a value within the closer perceived distance range outside of the fading window, the positions of the render strands are determined based on the higher level of detail only.

Therefore, a simulation can be performed for simulation strands which would otherwise have no simulation history due to the correspondence between the render strands and the simulation strands. Accordingly, a more realistic movement of the strands can be achieved.

In some examples, it may be desirable to stop simulating at a given level of detail. Therefore, the simulation model may not be computed beyond a particular distance range. Instead, the method may comprise determining the position of the render strands such that they are static with respect to an underlying rig. For example, if the underlying rig corresponds to the skull of a character's head, the strands move together with the movement of the skull, but do not exhibit movement relative to the skull. At long perceived distances the strands and an object comprising the strands may have a small appearance. Therefore, any simulated movement of the strands may appear smaller, or will not be as discernible. Therefore, the computational cost of the simulation may be reduced by stopping any simulation of the strands.

The method may comprise computing the simulation model for a first perceived distance range, and determining a skinned position for each render strand based on skinning initial authored positions of render strands for a second perceived distance range, greater than the first perceived distance range.

Similarly to when fading between two different simulated levels of detail, a fading window may be utilised in order to smoothly transition between simulating in a given level of detail in the first, closer perceived distance range and stopping the simulation at the further distance range, for a non-simulated level of detail.

In some examples, the method comprises computing the simulation model in the fading window, and determining a simulated position of a temporary strand based on the simulation model, and performing interpolation of the simulated position and skinned position to determine the position of the render strand. Respective weights may be applied to the simulated position and skinned position based on the distance within the fading window. That is, at the nearest edge of the fading window, the simulated position will be provided with a greater weight than the skinned position. As the distance into the fading window increases, the weight of the simulated position will decrease, and the weight of the skinned position will increase. Accordingly, the results of the interpolation mean that the render strands smoothly transition from being rendered according to the simulation model to being rendered according to skinned positions of the initial authored strands.

Figure 6:
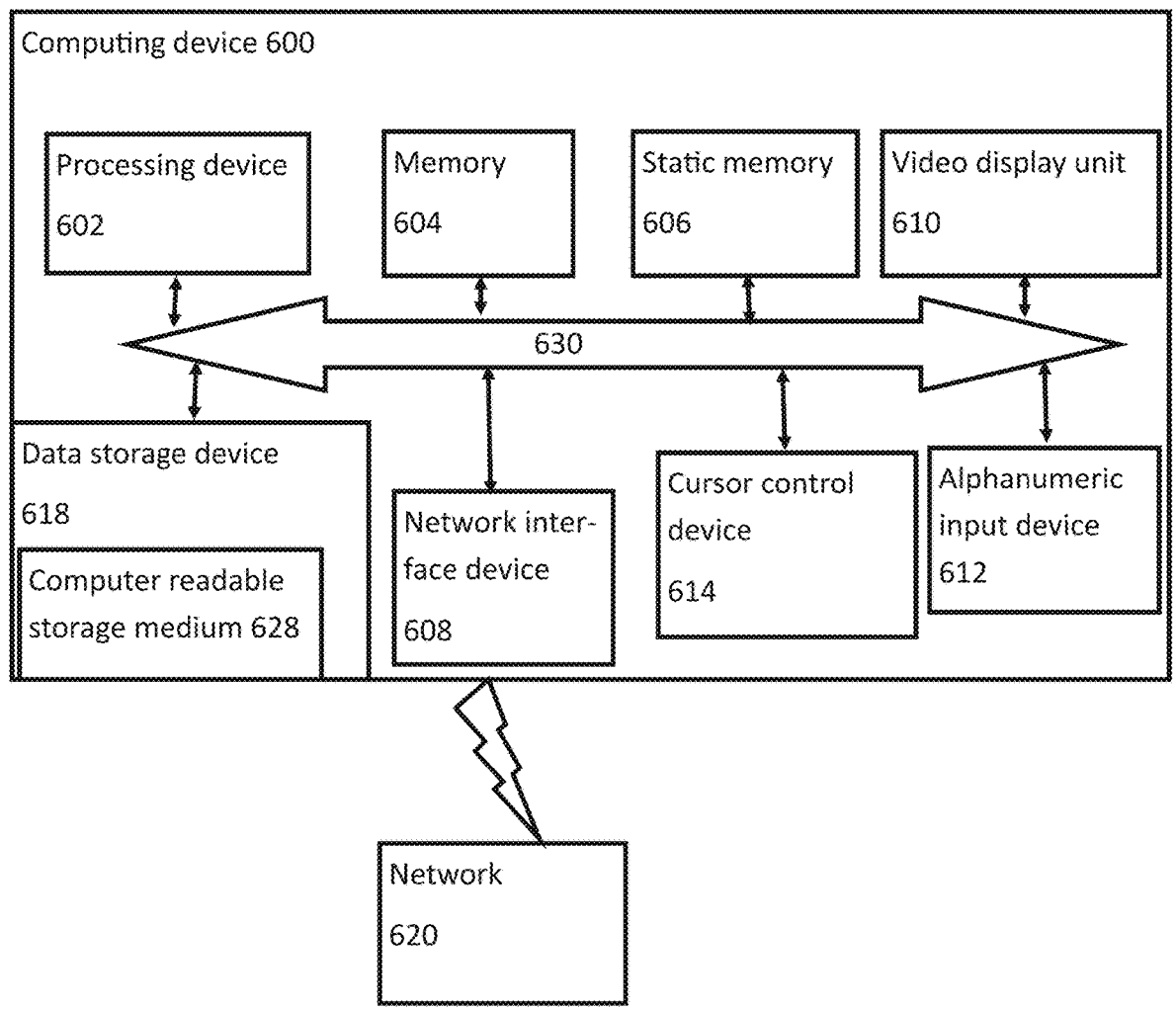
FIG. 6 is an illustration of a computing device for performing processes according to aspects of the specification.

FIG. 6 illustrates a diagrammatic representation of a computing device 600 within which a set of instructions, for causing the machine to perform any one or more of the methodologies discussed herein, may be executed. The computing device 600 may be a computing device (e.g., a server computer) within which a set of instructions, for causing the machine to perform any one or more of the methodologies discussed herein, may be executed. In alternative embodiments, the machine may be connected (e.g., networked) to other machines in a LAN, an intranet, an extranet, or the Internet. The machine may operate in the capacity of a server machine in client-server network environment. The machine may be a personal computer (PC), a set-top box (STB), a server, a network router, switch or bridge, or any machine capable of executing a set of instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example computing device 600 includes a processing device (e.g., a processor) 602, a main memory 604 (e.g., read-only memory (ROM), flash memory, dynamic random access memory (DRAM) such as synchronous DRAM (SDRAM)), a static memory 606 (e.g., flash memory, static random access memory (SRAM)) and a data storage device 618, which communicate with each other via a bus 630.

Processing device 602 represents one or more processing devices. In particular, the processing device comprises one or more graphics processing units (GPU) capable of processing blocks of data in parallel. The processing device may comprise one or more general purpose processing devices such as a microprocessor, central processing unit, or the like. More particularly, the processing device 602 may be a complex instruction set computing (CISC) microprocessor, reduced instruction set computing (RISC) microprocessor, very long instruction word (VLIW) microprocessor, or a processor implementing other instruction sets or processors implementing a combination of instruction sets. The processing device 602 may also be one or more special-purpose processing devices such as an application specific integrated circuit (ASIC), a field programmable gate array (FPGA), a digital signal processor (DSP), network processor, or the like. The processing device 602 is configured to execute the operations and steps discussed herein with respect to FIGS. 1 to 5.

The computing device 600 may further include a network interface device 608 which may communicate with a network 620. The computing device 600 also may include a video display unit 610 (e.g., a liquid crystal display (LCD) or a cathode ray tube (CRT)), an alphanumeric input device 612 (e.g., a keyboard), a cursor control device 614 (e.g., a mouse) and a signal generation device 616 (e.g., a speaker). In one embodiment, the video display unit 610, the alphanumeric input device 612, and the cursor control device 614 may be combined into a single component or device (e.g., an LCD touch screen).

The data storage device 618 may include a computer-readable storage medium 628 on which is stored one or more sets of instructions embodying any one or more of the methodologies or functions described herein with respect to FIGS. 1 to 5. The instructions may also reside, completely or at least partially, within the main memory 604 and/or within the processing device 602 during execution thereof by the computing device 600, the main memory 604 and the processing device 602 also constituting computer-readable media. The instructions may further be transmitted or received over a network 620 via the network interface device 608.

While the computer-readable storage medium 628 is shown in an example embodiment to be a single medium, the term "computer-readable storage medium" should be taken to include a single medium or multiple media (e.g., a centralized or distributed database and/or associated caches and servers) that store the one or more sets of instructions. The term "computer-readable storage medium" shall also be taken to include any medium that is capable of storing, encoding or carrying a set of instructions for execution by the machine and that cause the machine to perform any one or more of the methodologies of the present disclosure. The term "computer-readable storage medium" shall accordingly be taken to include, but not be limited to, solid-state memories, optical media and magnetic media.

In the above description, numerous details are set forth. It will be apparent, however, to one of ordinary skill in the art having the benefit of this disclosure that embodiments of the disclosure may be practiced without these specific details. In some instances, well-known structures and devices are shown in block diagram form, rather than in detail, in order to avoid obscuring the description.

Some portions of the detailed description are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here and generally, conceived to be a self-consistent sequence of steps leading to a desired result. The steps are those requiring physical manipulation of physical quantities. Usually, though not necessarily, these quantities take the form of electrical or magnetic signals capable of being stored, transferred, combined, compared and otherwise manipulated. It has been proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as "receiving," "identifying," "classifying," "reclassifying," "determining," "adding," "analyzing," or the like, refer to the actions and processes of a computer system, or similar electronic computing device, that manipulates and transforms data represented as physical (e.g., electronic) quantities within the computer system's registers and memories into other data similarly represented as physical quantities within the computer system memories or registers or other such information storage, transmission or display devices.

Embodiments of the disclosure also relate to an apparatus for performing the operations herein. This apparatus may be specially constructed for the required purpose, or it may comprise a general purpose computer selectively activated or reconfigured by a computer program stored in the computer. Such a computer program may be stored in a non-transitory computer readable storage medium, such as, but not limited to, any type of disk including floppy disks, optical disks, CD-ROMS and magnetic-optical disks, read-only memories (ROMs), random access memories (RAMs), EPROMs, magnetic or optical cards, flash memory, or any type of media suitable for storing electronics instructions.

The words "example" or "exemplary" are used herein to mean serving as an example, instance, or illustration. Any aspect or design described herein as "example" or "exemplary" is not necessarily to be construed as preferred or advantageous over other aspects of designs. Rather, use of the words "example" or "exemplary" is intended to present concepts in a concrete fashion. As used in this application, the term "or" is intended to mean an inclusive "or" rather than an exclusive "or". That is, unless specified otherwise, or clear from context, "X includes A or B" in intended to mean any of the natural inclusive permutations. That is, if X includes A; X includes B; or X includes both A and B, then "X includes A and B" is satisfied under any of the foregoing instances. In addition, the articles "a" and "an" as used in this specification and the appended claims should generally be construed to mean "one or more" unless specified otherwise or clear from context to be directed to a singular form. Moreover, use of the term "an embodiment" or "one embodiment" or "an implementation" or "one implementation" throughout is not intended to mean the same embodiment or implementation unless described as such. Furthermore, the terms "first," "second," "third," "fourth," etc. as used herein are meant as labels to distinguish among different elements and may not necessarily have an ordinary meaning according to their numerical have a ordinal meaning according to their numerical designation.

The algorithms and displays presented herein presented herein are inherently related to any particular computer or other apparatus. Various general purpose systems may be used with programs in accordance with the teachings herein, or it may prove convenient to construct a more specialized apparatus to perform required method steps. The required structure for a variety of these systems will appear from the description. In addition, the present disclosure is not described with reference to any particular programming language. It will be appreciated that a variety of programming languages may be used to implement the teachings of the disclosure as described herein.

The above description sets forth numerous specific details such as examples of specific systems, components, methods and so forth, in order to provide a good understanding of several embodiments of the present disclosure. It will be apparent to one skilled in the art, however, that at least some embodiments of the present disclosure may be practiced without these specific details. In other instances, well-known components or method are not described in detail or are presented in simple block diagram format in order to avoid unnecessarily obscuring the present disclosure. Particular implementations may vary from these example details and still be contemplated to be within the scope of the present disclosure.

It is to be understood that the above description is intended to be illustrative and not restrictive. Many other embodiments will be apparent to those of skill in the art upon reading and understanding the above description. The scope of the disclosure should, therefore, be determined with reference to the appended claims, along with the full scope of equivalents to which such claims are entitled.

The invention claimed is:

1. A computer implemented method comprising:
   determining positions of a number of render strands based on a simulation model of simulation strands, wherein each simulation strand in the simulation model corresponds to a render strand, and the number of simulation strands is less than or equal to the number of render strands, wherein:
   for a first range of values of a metric less than or equal to a first threshold value, the simulation model is determined in a first simulation level based on a first set of the simulation strands;
   for a second range of values of the metric greater than or equal to a second threshold value, the simulation model is determined in a second simulation level based on a second set of the simulation strands, the second set of simulation strands corresponding to a subset of the first set of simulation strands; and
   for metric values between the first and second threshold values, a transition between the first simulation level and the second simulation level comprises:
      computing the simulation model in the first simulation level, wherein simulation model results for simulation strands of the first simulation level are available for corresponding simulation strands of the second simulation level, and
      deriving positions of each render strand from the first set of simulation strands having a first weight and the second set of simulation strands having a second weight,
   wherein the first weight decreases as the value of the metric increases from the first threshold value to the second threshold value, and the second weight increases as the value of the metric increases from the first threshold value to the second threshold value,
   wherein the second simulation level is a non-simulated level, and the method further comprises:
      determining a position of a temporary strand for each render strand, based on the first set of simulation strands and, for values of the metric less than or equal to the first threshold value, determining the position of each render strand to be the position of the corresponding temporary strand:
      determining a skinned position for each render strand based on, skinning initial authored positions of render strands to an underlying rig and, for values of the metric greater than or equal to the second threshold value, determining the position of each render strand to be the corresponding skinned position; and
      determining the position of each render strand for values of the metric between the first and second threshold values by interpolating the position of the temporary strand and the skinned position using the first and second weights.

2. A method according to claim 1, wherein transitioning between the first simulation level and second simulation further comprises:

generating, for each render strand, a respective first temporary render strand having a respective first temporary position based on the first set of simulation strands;

generating, for each render strand, a respective second temporary render strand having a respective second temporary position based on the second set of simulation strands; and determining a position for each render strand based on the first temporary position and the first weight, and the second temporary position and the second weight.

3. A computer implemented method according to claim 2, further comprising:

interpolating, for each render strand, the respective first temporary position and respective second temporary position using the first weight and second weight, to determine the position for each render strand during the transition from the first simulation level to the second simulation level.

4. A computer implemented method according to claim 3, further comprising:

Determining interpolation data for the render strands for each of the first and second simulation levels respectively, wherein the interpolation data for each render strand in each of respective first and second simulation levels comprises indices of one or more selected simulation strands of the respective simulation level and a respective weight for each index, the selected simulation strands being selected based on a distance between initial authored positions of the simulation strands of the respective simulation level and an initial authored position of the render strand;

storing the interpolation data for each of the first and second simulation levels;

for the first simulation level, interpolating positions of the selected simulation strands using the interpolation data for the first simulation level for each render strand to compute the first temporary position, wherein for values of the metric less than or equal to the first threshold value, the first temporary position is determined to be the position of the render strand, for the second simulation level, interpolating positions of the selected simulation strands using the interpolation data for the second simulation level for each render strand to compute the second temporary position, wherein for values of the metric greater than or equal, to the second threshold value, the second temporary position is determined to be the position of the render strand.

5. A computer implemented method according to claim 1, wherein the metric corresponds to a perceived distance value, and the simulation level transitions from the first simulation level to the second simulation level as the perceived distance value increases from the first threshold value to the second threshold value.

6. A computer implemented method according to claim 1, wherein, when transitioning from the second simulation level to the first simulation level, the initial positions of the first set of simulation are strands are determined such that for each simulation strand included in the second set of simulation strands, the initial position corresponds to the position of the corresponding simulation strand of the second set of simulation strands, based on the determined simulation model in the second simulation level; and for each simulation strand of the first set of simulation strands not included in the second set of simulation strands, determining an initial position comprises assigning a position of the corresponding render strand determined based on the simulation model in the second simulation level.

7. A computer implemented method according to claim 1, wherein each render strand comprises a plurality of points, and determining positions of the render strands comprises determining positions of each point of the plurality of points.

8. Apparatus comprising one or more processors and a memory, the memory comprising instructions that, when executed by the one or more processors, cause the one or more processors to perform:

determining positions of a number of render strands based on a simulation model of simulation strands, wherein each simulation strand in the simulation model corresponds to a render strand, and the number of simulation strands is less than or equal to the number of render strands, wherein:

for a first range of values of a metric less than or equal to a first threshold value, the simulation model is determined in a first simulation level based on a first set of the simulation strands;

for a second range of values of the metric greater than or equal to a second threshold value, the simulation model is determined in a second simulation level based on a second set of the simulation strands, the second set of simulation strands corresponding to a subset of the first set of simulation strands; and for metric values between the first and second threshold values, a transition between the first simulation level and the second simulation level comprises:

computing the simulation model in the first simulation level, wherein simulation model results for simulation strands of the first simulation level are available for corresponding simulation strands of the second simulation level, and deriving positions of each render strand from the first set of simulation strands having a first weight and the second set of simulation strands having a second weight, wherein the first weight decreases as the value of the metric increases from the first threshold value to the second threshold value, and the second weight increases as the value of the metric increases from the first threshold value to the second threshold value, and wherein the second simulation level is a non-simulated level, and the instructions, when executed by the one or more processors, are further configured to cause the one or more processors to perform:

determining a position of a temporary strand for each render strand, based on the first set of simulation strands and for values of the metric less than or equal to the first threshold value, determining the position of each render strand to be the position of the corresponding temporary strand, determining a skinned position for each render strand based on skinning initial authored positions of render strands to an underlying rig and, for values of the metric greater than or equal to the second threshold value, determining the position of each render strand to be the corresponding skinned position, and determining the position of each render strand for values of the metric between the first and second threshold values by interpolating the position of the temporary strand and the Skinned position using the first and second weights.

9. Apparatus according to claim 8, wherein transitioning between the first simulation level and second simulation further comprises:
- generating, for each render strand, a respective first temporary render strand having a respective first temporary position based on the first set of simulation strands;
- generating, for each render strand, a respective second temporary render strand having a respective second temporary position based on the second set of simulation strands; and
- determining a position for each render strand based on the first temporary position and the first weight, and the second temporary position and the second weight.

10. Apparatus according to claim 9, wherein the instructions, when executed by the one or more processors, are further configured to cause the one or more processors to perform:
- interpolating, for each render strand, the respective first temporary position and respective second temporary position using the first weight and second weight, to determine the position for each render strand during the transition from the first simulation level to the second simulation level.

11. Apparatus according to claim 10, Wherein the instructions, when executed by the one or more processors, are further configured to cause the one or more processors to perform:
- determining interpolation data for the render strands for each of the first and second simulation levels respectively, wherein the interpolation data for each render strand in each of respective first and second simulation levels comprises indices of one or more selected simulation strands of the respective simulation level and a respective weight for each index, the selected simulation strands being selected based on a distance between initial authored positions of the simulation strands of the respective simulation level and an initial authored position of the render strand;
- storing the interpolation data for each of the first and second simulation levels;
- for the first simulation level, interpolating positions of the selected simulation strands using the interpolation data for the first simulation level for each render strand to compute the first temporary position, wherein for values of the metric less than or equal to the first threshold value, the first temporary position is determined to be the position of the render strand,
- for the second simulation level, interpolating positions of the selected simulation strands using the interpolation data for the second simulation level for each render strand to compute the second temporary position, wherein for values of the metric greater than or equal to the second threshold value, the second temporary position is determined to be the position of the render strand.

12. Apparatus according to claim 8, wherein when transitioning from the second simulation level to the first simulation level, the initial positions of the first set of simulation are strands are determined such that for each simulation strand included in the second set of simulation strands the initial position corresponds to the position of the corresponding simulation strand of the second set of simulation strands, based on the determined simulation model in the second simulation level; and
- for each simulation strand of the first set of simulation strands not included in the second set of simulation strands, determining an initial position comprises assigning a position of the corresponding render strand determined based on the simulation model in the second simulation level.

13. Apparatus according to claim 8, wherein the one or more processors comprise at least one graphics processing unit.

14. A non-transitory computer readable medium storing instructions which, when executed by a processor, cause the processor to perform:
- determining positions of a number of render strands based on a simulation model of simulation strands, wherein each simulation strand in the simulation model corresponds to a render strand, and the number of simulation strands is less than or equal to the number of render strands, wherein:
- for a first range of values of a metric less than or equal to a first threshold value, the simulation model is determined in a first simulation level based on a first set of the simulation strands;
- for a second range of values of the metric greater than or equal to a second threshold value, the simulation model is determined in a second simulation level based on a second set of the simulation strands, the second set of simulation strands corresponding, to a subset of the first set of simulation strands; and
- for metric values between the first and second threshold values, a transition between the first simulation level and the second simulation level comprises:
- computing the simulation model in the first simulation level, wherein simulation model results for simulation strands of the first simulation level are available for corresponding simulation strands of the second simulation level, and deriving the positions of the render strands from the first set of simulation strands having a first weight and the second set of simulation strands having a second weight,
- wherein the first weight decreases as the value of the metric increases from the first threshold value to the second threshold value, and the second weight increases as the value of the metric increases from the first threshold value to the second threshold value, and
- wherein the second simulation level is a non-simulated level, and the instructions, when executed by the processor, are further configured to cause the processor to perform:
- determining a position of a temporary strand for each render strand, based on the simulation model in the first set of simulation strands and, for values of the metric less than or equal to the first threshold value determining the position of each render strand to be the position of the corresponding temporary strand,
- determining a skinned position for each render strand based on skinning initial authored positions of render strands to an underlying rig and, for values of the metric greater than or equal to the second threshold value, determining the position of each render strand to be the corresponding skinned position, and
- determining the position of each render strand for values of the metric between the first and second threshold values by interpolating the position of the temporary strand and the skinned position using the first and second weights.

15. A computer readable medium according to claim 14, wherein transitioning between the first simulation level and second simulation further comprises:

generating, for each render strand, a respective first temporary render strand having a respective first temporary position based on the first set of simulation strands;

generating, for each render strand, a respective second temporary render strand having a respective second temporary position based on the second set of simulation strands; and interpolating, for each render strand, the respective first temporary position and respective second temporary position using the first weight and second weight, to determine the position for each render strand.

16. A computer readable medium according to claim 15, wherein the instructions, when executed by the processor, are further configured to cause the processor to perform:

determining interpolation data for the render strands for each of the first and second simulation levels respectively, wherein the interpolation data for each render strand in each of respective first and second simulation levels comprises indices of one or more selected simulation strands of the respective simulation level and a respective weight for each index, the selected simulation strands being selected based on a distance between initial authored positions of the simulation strands of the respective simulation level and an initial authored position of the render strand;

storing the interpolation data for each of the first and second simulation levels;

for the first simulation level, interpolating positions of the selected simulation strands using the interpolation data for the first simulation level for each render strand to compute the first temporary position, wherein for values of the metric less than or equal to the first threshold value, the first temporary position is determined to be the position of the render strand, for the second simulation level, interpolating positions of the selected simulation strands using the interpolation data for the second simulation level for each render strand to compute the second temporary position, wherein for values of the metric greater than or equal to the second threshold value, the second temporary position is determined to be the position of the render strand.

17. A computer readable medium according to claim 14, wherein, when transitioning from the second simulation level to the first simulation level, the positions of the first set of simulation are strands are determined such that for each simulation strand included in the second set of simulation strands, the initial position corresponds to the position of the corresponding simulation strand of the second set of simulation strands, based on the determined simulation model in the second simulation level; and for each simulation strand of the first set of simulation strands not included in the second set of simulation strands, determining an initial position comprises assigning a position of the corresponding render strand determined based on the simulation model in the second simulation level.

\* \* \* \* \*